(12) United States Patent
Lin et al.

(10) Patent No.: US 6,521,470 B1
(45) Date of Patent: Feb. 18, 2003

(54) METHOD OF MEASURING THICKNESS OF EPITAXIAL LAYER

(75) Inventors: Ching-Fu Lin, Taipei (TW); Hua-Chou Tseng, Hsin-Chu (TW); Teng-Chi Yang, Kaohsiung (TW)

(73) Assignee: United Microelectronics Corp. (TW)

( * ) Notice: Subject to any disclaimer, the term of this patent is extended or adjusted under 35 U.S.C. 154(b) by 0 days.

(21) Appl. No.: 10/145,696

(22) Filed: May 16, 2002

Related U.S. Application Data

(60) Provisional application No. 60/336,395, filed on Oct. 31, 2001.

(51) Int. Cl.$^7$ .............................................. H01L 21/66
(52) U.S. Cl. ........................ 438/17; 438/14; 438/507
(58) Field of Search .................... 438/14, 17, 180, 438/259, 507, 478, 504, 974, 479, 481, 503, 502; 148/33, 33.4; 356/371

(56) References Cited

U.S. PATENT DOCUMENTS

| | | | | |
|---|---|---|---|---|
| 4,912,087 A | * | 3/1990 | Aslam et al. | 204/192.24 |
| 5,375,064 A | * | 12/1994 | Bollinger | 156/345.24 |
| 5,449,638 A | * | 9/1995 | Hong et al. | 148/DIG. 12 |
| 5,604,581 A | * | 2/1997 | Liu et al. | 356/632 |
| 5,705,423 A | * | 1/1998 | Sakata et al. | 117/97 |
| 6,030,887 A | * | 2/2000 | Desai et al. | 438/507 |
| 6,045,626 A | * | 4/2000 | Yano et al. | 117/950 |

FOREIGN PATENT DOCUMENTS

| | | | | |
|---|---|---|---|---|
| JP | 02096640 | * | 4/1990 | 21/41 |
| JP | 02206146 | * | 8/1990 | 21/66 |
| JP | 03095405 | * | 4/1991 | 15/20 |
| JP | 04316347 | * | 11/1992 | 21/66 |
| JP | 11288884 | * | 10/1999 | 21/203 |
| JP | 2001264022 | * | 9/2001 | 11/6 |

\* cited by examiner

*Primary Examiner*—Tuan H. Nguyen
*Assistant Examiner*—Laura Schillinger
(74) *Attorney, Agent, or Firm*—Powell Goldstein Frazer & Murphy LLP

(57) ABSTRACT

A method of measuring the thickness of an epitaxial layer is disclosed. The method is particularly useful in measuring the epitaxial layer with a doping concentration lower than or similar to the substrate on which the epitaxial layer is formed. The method uses a non-single crystal layer previously formed on the substrate before forming the epitaxial layer over the substrate so that the portion of the epitaxial layer on the non-single crystal layer will be polycrystal. To obtain the thickness of the epitaxial layer, thicknesses of the polycrystal layer and the non-single crystal layer as well as the thickness difference between the polycrystal layer plus the non-single crystal layer and the epitaxial layer are measured. The thickness of the epitaxial layer equals the result of the total thickness of the polycrystal layer plus the non-single crystal layer minus the thickness difference between the polycrystal layer plus the non-single crystal layer and the epitaxial layer.

19 Claims, 1 Drawing Sheet

METHOD OF MEASURING THICKNESS OF EPITAXIAL LAYER

This application claims the benefit of Ser. No. 60/336,395, filed Oct. 31, 2001.

BACKGROUND OF THE INVENTION

1. Field of the Invention

The present invention relates to a method of measuring the thickness of an epitaxial layer, and more particularly to an in-line method of measuring the thickness of an epitaxial layer.

2. Description of the Related Art

As is well known, it is important in the fabrication of semiconductor devices to know the thickness of an epitaxial layer on a semiconductor wafer. Different methods are known within the prior art for measuring or determining the thickness of an epitaxial layer including methods based upon IR interference physical optic theory. In accordance with such theory, IR energy is directed onto a wafer and is reflected from the surface of the epitaxial layer and from the interface between the epitaxial layer and the underlying substrate. The IR energy is directed as an incident beam onto a small area of the wafer at a position where the epitaxial thickness is to be measured. Such incident beam is divided to form two reflected beams. One beam is reflected from the surface of the epitaxial layer and the other beam is reflected from the epitaxial layer/substrate interface. The two reflected beams interface with each other in such a manner that the epitaxial thickness can be determined by spectral reflectance and interferometric methods.

The spectral reflectance method is based on the phenomena that the degree of optical interference between the two reflected beams cyclically varies at each wavelength across a spectrum. The variation produces a series of maxima and minima reflectance values in accordance with the degree of constructive and destructive interference at the different wavelengths. Such method generally involves measuring the spectral reflectance and then calculating the thickness using the reflectance at two different maxima or minima.

In the interferometric method, an interferometer is used to generate an interferogram from the two reflected beams. The interferogram includes a center burst or peak and two side bursts or peaks created as a result of displacement of the interferometer mirror. In a perfect system, the interferometer would be symmetrical and the degree of mirror displacement between two positions corresponding to two of the bursts or peaks, is proportional to the epitaxial thickness. In actual practice however, the interferogram is asymmetrical and a double Fourier Transform and other mathematical manipulations are performed to create an idealized interferogram from which the thickness is calculated as a function of mirror displacement between the side peaks.

However, when the difference of doping concentrations between the epitaxial layer and the substrate which are the same material such as silicon is negligible or the doping concentration of the epitaxial layer is lower than the doping concentration of the substrate, the optical methods such as the Fourier-Transform Infrared Spectroscopy (FTIR) method set forth and other conventional electrical methods such as the four point probe method will not be suitable anymore.

Therefore, it is necessary to provide a new method to solve the problems mentioned above, and the method of the present invention is just the one.

SUMMARY OF THE INVENTION

It is therefore an object of the invention to provide a new method of measuring the thickness of an epitaxial layer that are always available particularly when the doping concentration of the epitaxial layer is lower than or the same as the doping concentration of the substrate.

It is another object of this invention to provide a new in-line method of measuring the thickness of an epitaxial layer when the materials of the epitaxial layer and the substrate are the same.

It is a further object of this invention to provide a new method of measuring the thickness of an epitaxial layer and the growth rate ratio of a polycrystal layer to a single crystal layer.

To achieve these objects, and in accordance with the purpose of the invention, the invention uses a method of measuring the thickness of an epitaxial layer. The method comprises the steps: an ousubstrate having a non-single crystal layer thereon, wherein the non-single crystal layer only covers a portion of the substrate; forming an epitaxial layer over the substrate and the non-single crystal layer, wherein the portion of the epitaxial layer on the non-single crystal layer grows into a polycrystal layer; measuring the thickness of the polycrystal layer and the thickness of the non-single crystal layer; and measuring the thickness difference between the polycrystal layer plus the non-single crystal layer and the epitaxial layer, thereby the thickness of said epitaxial layer equals to the result of the total thickness of the polycrystal layer plus the non-single crystal layer minus the thickness difference between the polycrystal layer plus the non-single crystal layer and the epitaxial layer.

It is to be understood that both the foregoing general description and the following detailed description are exemplary and explanatory only and are not restrictive of the invention, as claimed.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DESCRIPTION OF THE PREFERRED EMBODIMENT

It is to be understood and appreciated that the process steps and structures described below do not cover a complete process flow. The present invention can be practiced in conjunction with various integrated circuit fabrication techniques that are used in the art, and only so much of the commonly practiced process steps are included herein as are necessary to provide an understanding of the present invention.

The present invention will be described in detail with reference to the accompanying drawings. It should be noted that the drawings are in greatly simplified form and they are not drawn to scale. Moreover, dimensions have been exaggerated in order to provide a clear illustration and understanding of the present invention.

Figure 1:
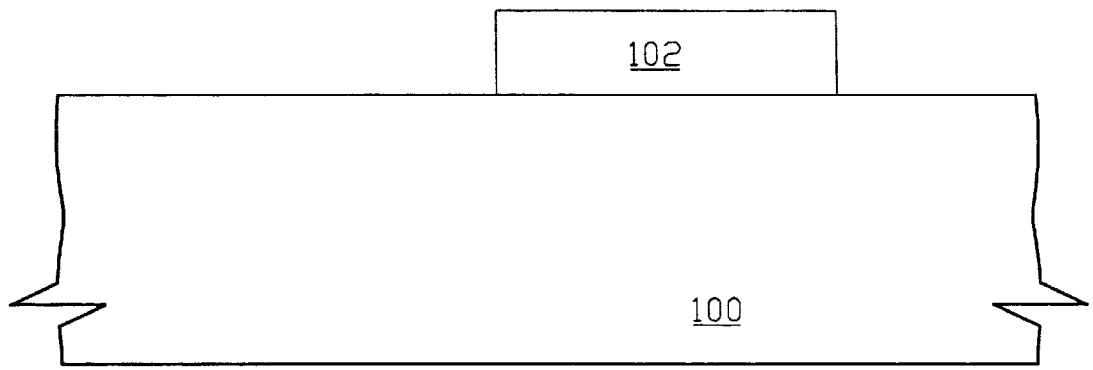
FIG. 1 shows a cross-sectional view of a substrate having a non-single crystal layer thereon.

Referring to FIG. 1, a substrate 100 having a layer 102 thereon is shown. The substrate 100 comprises, but is not limited to: a silicon substrate with a <100>crystallographic orientation. The substrate can also comprise other semiconductor substrate such as diamond-like carbon as well as germanium, gallium arsenide and indium arsenide. The layer 102 comprises a non-single crystal layer such as a polycrystal layer. The layer 102 can be a conductive layer such as a polysilicon layer or a dielectric layer such as a silicon dioxide layer or a silicon nitride layer. The thickness of the layer 102, for example, can be preferably from about 100 angstrom to about 200 angstrom but it can be thicker or thinner.

Figure 2:
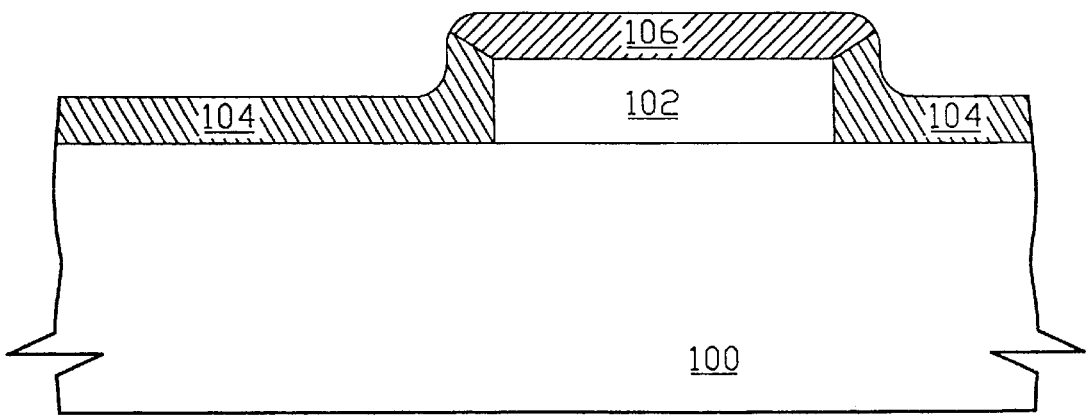
FIG. 2 shows a result of forming an epitaxial layer over the structure shown in FIG. 1.

Referring to FIG. 2, an epitaxial layer 104 is formed over the substrate 100 and the layer 102. The material of the epitaxial layer 104 should be the same with the material of the substrate 100. For example, if the substrate 100 is a silicon substrate with a <100>crystallographic orientation, the epitaxial layer 104 should be an epitaxial silicon layer with a <100>crystallographic orientation. Because the layer 102 is a non-single crystal layer such as a polycrystal layer, the portion of the epitaxial layer on said non-single crystal layer 102 grows into a polycrystal layer 106 rather than a single crystal layer with a crystallographic orientation the same as the substrate. Accordingly, the polycrystal layer 106 will be a polysilicon layer if the epitaxial layer 104 is an epitaxial silicon layer. Usually, the substrate 100 such as a silicon substrate is doped and the epitaxial layer 104 is also in-situ doped with the same dopant as the substrate 100 being doped. Particularly, the thickness of the epitaxial layer 104 is difficult to find when the dopant concentration of the epitaxial layer 104 is lower or nearly the same with the dopant concentration of the substrate 100.

To find out the thickness of the epitaxial layer 104 $t_{epi}$, the thickness of the polycrystal layer 106 $t_{poly}$ and the thickness of the layer 102 $t_A$ must be determined. $t_{poly}$ and $t_A$ can be obtained by using conventional optical methods. Typically, one can use an Ellisometer to measure $t_{poly}$ and $t_A$ by the reflection or absorption of the laser light beam emitting onto the layer 102 and the polycrystal layer 106. The Ellisometer employs maximizing of internal reflection or absorption of laser light into a light transmittable layer of material. The intensity of remaining light emanating outwardly through or from the upper surface is monitored. Thickness and planarity are determinable therefrom.

The thickness difference $t_\Delta$ between the epitaxial layer 104 and the layer 102 plus the polycrystal layer 106 can be measured by using a probe-based surface characterization or metrology instrument such as a profiler. The profiler utilizes atomic force to detect the vertical position of its probe while the probe scans across the surfaces of the epitaxial layer 104 and the polycrystal layer 106 thereby $t_\Delta$ can be obtained. The thickness of the epitaxial layer 104 $t_{epi}$ can be obtained by the following equation: $t_{epi}=t_{poly}+t_A-t_\Delta$. The growth rate ratio $t_{poly}/t_{epi}$ can be also obtained.

Other embodiments of the invention will appear to those skilled in the art from consideration of the specification and practice of the invention disclosed herein. It is intended that the specification and examples be considered as exemplary only, with the true scope and spirit of the invention being indicated by the following claims.

What is claim is:

1. A method of measuring the thickness of an epitaxial layer, said method comprising:

providing a substrate having a non-single crystal layer thereon, wherein said non-single crystal layer only covers a portion of said substrate;

forming an epitaxial layer over said substrate and said non-single crystal layer, wherein the portion of said epitaxial layer on said non-single crystal layer grows into a polycrystal layer;

measuring the thickness of said polycrystal layer and the thickness of said non-single crystal layer; and measuring the thickness difference between said polycrystal layer plus said non-single crystal layer and said epitaxial layer, thereby the thickness of said epitaxial layer equals to the result of the total thickness of said polycrystal layer plus said non-single crystal layer minus the thickness difference between said polycrystal layer plus said non-single crystal layer and said epitaxial layer.

2. The method according to claim 1, wherein said substrate comprises a silicon substrate.

3. The method according to claim 1, wherein said substrate comprises a GaAs substrate.

4. The method according to claim 1, wherein said non-single crystal layer comprises a polycrystal layer.

5. The method according to claim 1, wherein the thickness of said polycrystal layer and the thickness of said non-single crystal layer are measured by using a ellisometer.

6. The method according to claim 1, wherein the thickness difference between said polycrystal layer plus said non-single crystal layer and said epitaxial layer is measured by using a profiler.

7. A method of measuring the thickness of an epitaxial layer, said method comprising:

providing a substrate having a dielectric layer thereon, wherein said dielectric layer only covers a portion of said substrate;

forming an epitaxial layer over said substrate and said dielectric layer, wherein the portion of said epitaxial layer on said dielectric layer grows into a polycrystal layer;

measuring the thickness of said polycrystal layer and the thickness of said dielectric layer; and measuring the thickness difference between said polycrystal layer plus said dielectric layer and said epitaxial layer, thereby the thickness of said epitaxial layer equals to the result of the total thickness of said polycrystal layer plus said dielectric layer minus the thickness difference between said polycrystal layer plus said dielectric layer and said epitaxial layer.

8. The method according to claim 7, wherein said substrate comprises a silicon substrate.

9. The method according to claim 7, wherein said substrate comprises a GaAs substrate.

10. The method according to claim 7, wherein said dielectric layer comprises a polycrystal layer.

11. The method according to claim 7, wherein the thickness of said polycrystal layer and the thickness of said dielectric layer are measured by using a ellisometer.

12. The method according to claim 7, wherein the thickness difference between said polycrystal layer plus said dielectric layer and said epitaxial layer is measured by using a profiler.

13. A method of measuring the thickness of an epitaxial layer, said method comprising:

providing a silicon substrate having a non-single crystal layer thereon, wherein said non-single crystal layer only covers a portion of said substrate;

forming an epitaxial silicon layer over said silicon substrate and said non-single crystal layer, wherein the portion of said epitaxial silicon layer on said non-single crystal layer grows into a polysilicon layer;

measuring the thickness of said polysilicon layer and the thickness of said non-single crystal layer; and measuring the thickness difference between said polysilicon layer plus said non-single crystal layer and said epitaxial silicon layer, thereby the thickness of said epitaxial silicon layer equals to the result of the total thickness of said polysilicon layer plus said non-single crystal layer minus the thickness difference between said polysilicon layer plus said non-single crystal layer and said epitaxial silicon layer.

14. The method according to claim 13, wherein said non-single crystal layer comprises a dielectric layer.

15. The method according to claim 14, wherein said dielectric layer comprises a silicon dioxide layer.

16. The method according to claim 14, wherein dielectric layer comprises a silicon nitride layer.

17. The method according to claim 14, wherein the thickness difference between said polysilicon layer plus said non-single crystal layer and said epitaxial silicon layer is measured by using a profiler.

18. The method according to claim 13, wherein said non-single crystal layer comprises a polysilicon layer.

19. The method according to claim 13, wherein the thickness of said polysilicon layer and the thickness of said non-single crystal layer are measured by using a ellisometer.

* * * * *